United States Patent
Ko et al.

(10) Patent No.: US 9,177,886 B2
(45) Date of Patent: Nov. 3, 2015

(54) SEMICONDUCTOR PACKAGE INCLUDING CHIP SUPPORT AND METHOD OF FABRICATING THE SAME

(71) Applicant: Samsung Electronics Co., Ltd., Suwon-si (KR)

(72) Inventors: Ji-Han Ko, Hwaseong-si (KR); Woo-Dong Lee, Cheonan-si (KR); Tae-Sung Park, Cheonan-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 13/672,310

(22) Filed: Nov. 8, 2012

(65) Prior Publication Data

US 2013/0270717 A1    Oct. 17, 2013

(30) Foreign Application Priority Data

Apr. 17, 2012   (KR) ................. 10-2012-0039859

(51) Int. Cl.
| | | |
|---|---|---|
| *H01L 23/48* | (2006.01) | |
| *H01L 23/52* | (2006.01) | |
| *H01L 29/40* | (2006.01) | |
| *H01L 23/04* | (2006.01) | |
| *H01L 23/12* | (2006.01) | |
| *H01L 23/31* | (2006.01) | |

(Continued)

(52) U.S. Cl.
CPC .......... *H01L 23/3128* (2013.01); *H01L 25/065* (2013.01); *H01L 25/105* (2013.01); *H01L 21/563* (2013.01); *H01L 23/49838* (2013.01); *H01L 2224/16225* (2013.01); *H01L 2224/32145* (2013.01); *H01L 2224/32225* (2013.01); *H01L 2224/48227* (2013.01); *H01L 2224/73204* (2013.01); *H01L 2224/73265* (2013.01); *H01L 2224/92247* (2013.01); *H01L 2225/0651* (2013.01); *H01L 2225/06517* (2013.01); *H01L 2225/06558* (2013.01); *H01L 2225/06562* (2013.01); *H01L 2225/1023* (2013.01); *H01L 2225/1058* (2013.01); *H01L 2924/15311* (2013.01)

(58) Field of Classification Search
CPC ................. H01L 25/0657; H01L 2924/01079; H01L 2224/16; H01L 2924/01029; H01L 2924/01078; H01L 2924/01013; H01L 2924/14; H01L 2924/15311; H01L 2224/48091; H01L 23/10; H01L 23/4006
USPC ......... 257/777, 778, 782, 786, 685, 686, 730, 257/731, 733
See application file for complete search history.

(56) References Cited

U.S. PATENT DOCUMENTS

| | | | |
|---|---|---|---|
| 5,315,070 A | * | 5/1994 | Maiwald ....................... 174/250 |
| 6,353,263 B1 | | 3/2002 | Dotta et al. |

(Continued)

FOREIGN PATENT DOCUMENTS

| | | | |
|---|---|---|---|
| JP | 405243715 | * | 9/1993 |
| KR | 10-2006-0076367 | | 7/2006 |
| KR | 10-2008-0084300 | | 9/2008 |

*Primary Examiner* — A. Sefer
*Assistant Examiner* — Dilinh Nguyen
(74) *Attorney, Agent, or Firm* — Onello & Mello, LLP

(57) ABSTRACT

A semiconductor package includes a circuit board comprising a first surface and a second surface opposite the first surface. A first semiconductor chip is stacked on the first surface and a second semiconductor chip stacked on the first semiconductor chip. A region of the second chip protrudes beyond a side of the first semiconductor chip. A support underpins the protruding region of the second chip. The support may be, for example, dry film solder resist dam.

15 Claims, 11 Drawing Sheets

(51) Int. Cl.
  *H01L 25/065* (2006.01)
  *H01L 25/10* (2006.01)
  *H01L 21/56* (2006.01)
  *H01L 23/498* (2006.01)

(56) References Cited

U.S. PATENT DOCUMENTS

| | | | |
|---|---|---|---|
| 6,633,086 B1 | 10/2003 | Peng et al. | |
| 6,858,938 B2 | 2/2005 | Michii | |
| 7,166,924 B2 | 1/2007 | Lu et al. | |
| 7,274,694 B1 * | 9/2007 | Cheng et al. | 370/389 |
| 7,365,427 B2 * | 4/2008 | Lu et al. | 257/723 |
| 7,859,119 B1 * | 12/2010 | St. Amand et al. | 257/777 |
| 2004/0212083 A1 | 10/2004 | Yang | |
| 2005/0156323 A1 | 7/2005 | Tokunaga | |
| 2006/0267609 A1 | 11/2006 | Lee et al. | |
| 2007/0001296 A1 | 1/2007 | Lee et al. | |
| 2012/0280404 A1 * | 11/2012 | Kwon et al. | 257/777 |

* cited by examiner

1300

SEMICONDUCTOR PACKAGE INCLUDING CHIP SUPPORT AND METHOD OF FABRICATING THE SAME

This application claims priority from Korean Patent Application No. 10-2012-0039859 filed on Apr. 17, 2012 in the Korean Intellectual Property Office, the disclosure of which is incorporated herein by reference in its entirety.

BACKGROUND

1. Field of the Inventive Concept Inventive concepts relate to a semiconductor package and a method of fabricating the same.

2. Description of the Related Art

A packaging technique, which may be referred to as two-channel, low-profile, cross-stacking may be employed to produce lighter, thinner, more compact electronic devices for use in mobile electronic products. In such an approach, low profile semiconductor chips may be stacked sequentially on a circuit board with a first semiconductor chip stacked on a circuit board along a first direction, and a second semiconductor chip stacked on the first semiconductor chip along a second direction perpendicular to the first direction.

When the second semiconductor chip is stacked on the first semiconductor, some regions of the second semiconductor chip may protrude from the first semiconductor chip, and the protruding regions of the second semiconductor chip may be bent, causing the second semiconductor chip to crack.

For example, in the process of wire-bonding the protruding regions of the second semiconductor chip to the circuit board, a force may be applied to the protruding regions of the second semiconductor chip, and the protruding regions of the second semiconductor chip may be bent by the applied force. In addition, when an encapsulant is molded on the protruding regions of the second semiconductor chip, the protruding regions of the second semiconductor chip may be bent by the weight of the encapsulant. When the protruding regions of the second semiconductor chip are bent down, it may be difficult to fill the spaces under the protruding regions of the second semiconductor chip with the encapsulant. Accordingly, cracks in the semiconductor chip or spaces devoid of encapsulant may reduce the reliability of products employing cross-stacked chips.

SUMMARY

Aspects of the present inventive concept provide a semiconductor package and a method of fabricating the same, in which a support, such as a dry film solder resist dam is between a protruding region of a semiconductor chip and a circuit board to prevent the deflection of the protruding region of the semiconductor chip or a crack in the chip. A semiconductor package in accordance with principles of inventive concepts is particularly well suited to application in a low profile cross stack product.

In accordance with principles of inventive concepts, a semiconductor package may include a circuit board comprising a first surface and a second surface opposite the first surface; a first semiconductor chip stacked on the first surface; a second semiconductor chip stacked on the first semiconductor chip, including a first protruding region which protrudes beyond a side of the first semiconductor chip; and a support between the first protruding region and the first surface to underpin the first protruding region.

A semiconductor package in accordance with principles of inventive concepts may include a support that is a dry film solder resist dam and may also include a liquid solder resist film covering at least part of the first surface of the circuit board, wherein the dry film solder resist dam is disposed on the liquid solder resist film.

In accordance with principles of inventive concepts a semiconductor package includes a plurality of supports that include dry film solder resist dams which comprise first and second dry film resist dams located on the side of the first semiconductor chip beyond which the first protruding region protrudes, wherein the second dry film resist dams are located closer to the side of the first semiconductor chip than the first dry film resist dams, and a cross section of each of the first dry film resist dams is different from a cross section of each of the second dry film resist dams.

In another aspect of a semiconductor package in accordance with principles of inventive concepts, the area of the cross section of the first dry film resist dams is larger than the area of the cross section of the second dry film resist dams.

In another aspect in accordance with principles of inventive concepts, a first cross section of a support is rectangular, and the second cross section of a second support is circular. The dry film solder resist dams may comprise a first column of dry film solder resist dams along a side of the second semiconductor chip and a second column of dry film solder resist dams along the side of the second semiconductor chip proximate the first column of the dry film solder resist dams. Additionally, the dry film solder resist dams may be arranged along a perimeter of the second semiconductor chip.

In another aspect in accordance with principles of inventive concepts, a semiconductor package may also include a third semiconductor chip stacked on the second semiconductor chip; a fourth semiconductor chip stacked on the third semiconductor chip and comprising a second protruding region protruding beyond a side of the third semiconductor chip; and a plurality of supports located between the second protruding region and the second semiconductor chip to support the second protruding region. The second protruding region may overlap at least part of the first protruding region, the supports may be epoxy dams between the first protruding region and the second protruding region.

In another aspect in accordance with principles of inventive concepts, a semiconductor package may include conductive wires electrically connecting the second semiconductor chip and the circuit board, wherein the conductive wires extend from the second semiconductor chip onto the first surface. The package may also include an encapsulant on the first surface to encapsulate the first semiconductor chip and the second semiconductor chip; and external connection terminals on the second surface.

In accordance with principles of inventive concepts, a method of fabricating a semiconductor package may include providing a circuit board which comprises a first surface and a second surface opposite the first surface; stacking a dry film solder resist film on the first surface; forming a plurality of dry film solder resist dams on the first surface by patterning the dry film solder resist film; stacking a first semiconductor chip on the first surface separate from the dry film solder resist dams; and stacking a second semiconductor chip on the first semiconductor chip and the dry film solder resist dams such that a region of the second semiconductor chip is supported by the first semiconductor chip and the other regions thereof are supported by the dry film solder resist dams.

The method may include a circuit board that comprises a liquid solder resist film covering at least part of the first surface, and the stacking the dry film solder resist film on the first surface comprises stacking the dry film solder resist dams on the liquid solder resist film. Steps in a method in accordance with principles of inventive concepts may also include wire-bonding the second semiconductor chip to the circuit board using conductive wires after stacking the second semiconductor chip; and molding the first semiconductor chip 20 and the second semiconductor chip with an encapsulant. Additionally, the formation of a plurality of dry film solder resist dams may include forming the first and second dry film solder resist dams by patterning the dry film solder resist film, and a cross section of each of the first dry film solder resist dams is different from a cross section of each of the second dry film solder resist dams.

A semiconductor system in accordance with principles of inventive concepts may include a semiconductor memory and a controller, wherein the semiconductor memory or controller is packaged in a cross-stacked package that includes a circuit board comprising a first surface and a second surface opposite the first surface; a first semiconductor chip stacked on the first surface; a second semiconductor chip stacked on the first semiconductor chip, including a first protruding region which protrudes beyond a side of the first semiconductor chip; and a support between the first protruding region and the first surface to underpin the first protruding region. In accordance with principles of inventive concepts, the controller and memory may be packaged in the cross-stacked package. A memory system in accordance with principles of inventive concepts may include a memory device packaged in such a way and may form a multimedia card or a secure digital card, for example. A mobile phone in accordance with principles of inventive concepts may employ semiconductor chips packaged in accordance with principles of inventive concepts.

BRIEF DESCRIPTION OF THE DRAWINGS

The above and other aspects and features of inventive concepts will become more apparent by describing in detail exemplary embodiments thereof with reference to the attached drawings, in which.

DETAILED DESCRIPTION OF THE EMBODIMENTS

Figure 1:
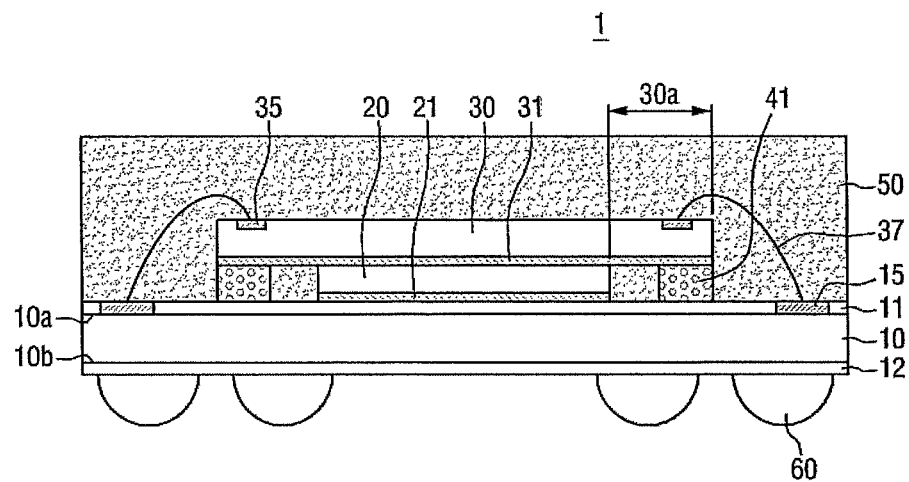
FIG. 1 is a cross-sectional view of a semiconductor package 1 according to a first exemplary embodiment in accordance with principles of inventive concepts.

Exemplary embodiments in accordance with principles of inventive concepts will now be described more fully with reference to the accompanying drawings, in which exemplary embodiments are shown. Exemplary embodiments in accordance with principles of inventive concepts may, however, be embodied in many different forms and should not be construed as being limited to the embodiments set forth herein; rather, these embodiments are provided so that this disclosure will be thorough and complete, and will fully convey the concept of exemplary embodiments to those of ordinary skill in the art. In the drawings, the thicknesses of layers and regions may be exaggerated for clarity. Like reference numerals in the drawings denote like elements, and thus their description may not be repeated.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (for example, "between" versus "directly between," "adjacent"

versus "directly adjacent," "on" versus "directly on"). The word "or" is used in an inclusive sense, unless otherwise indicated.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of exemplary embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "bottom," "below," "lower," or "beneath" other elements or features would then be oriented "atop," or "above," the other elements or features. Thus, the exemplary terms "bottom," or "below" can encompass both an orientation of above and below, top and bottom. The device may be otherwise oriented (rotated 90 degrees or at other orientations) and the spatially relative descriptors used herein interpreted accordingly.

The terminology used herein is for the purpose of describing particular embodiments only and is not intended to be limiting of exemplary embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Exemplary embodiments in accordance with principles of inventive concepts are described herein with reference to cross-sectional illustrations that are schematic illustrations of idealized embodiments (and intermediate structures) of exemplary embodiments. As such, variations from the shapes of the illustrations as a result, for example, of manufacturing techniques and/or tolerances, are to be expected. Thus, exemplary embodiments in accordance with principles of inventive concepts should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of exemplary embodiments.

Unless otherwise defined, all terms (including technical and scientific terms) used herein have the same meaning as commonly understood by one of ordinary skill in the art to which exemplary embodiments in accordance with principles of inventive concepts belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

In exemplary embodiments in accordance with principles of inventive concepts, a semiconductor package may include a support to prop, or underpin, a protruding region of a cross-stacked semiconductor chip. The support may be, for example, a dry film solder resist dam. By supporting cantilevered protruding regions, a semiconductor package including cross-stacked semiconductor chips in accordance with principles of inventive concepts may avoid the cracking of upper stacked chips that may otherwise occur, during wire-bonding, for example. Additionally, supporting cantilevered protruding regions may prevent the bending of protruding regions (which may or may not be accompanied by cracking of the second semiconductor chip), thereby ensuring that encapsulating material may fill the volume between first and second semiconductor chips without voids. In accordance with principles of inventive concepts, supporting protruding regions may improve the reliability of cross-stacked semiconductor chips by preventing the cracking of semiconductor chips, during wire-bonding, for example, and by preventing voids in encapsulant material, for example.

Figure 2:
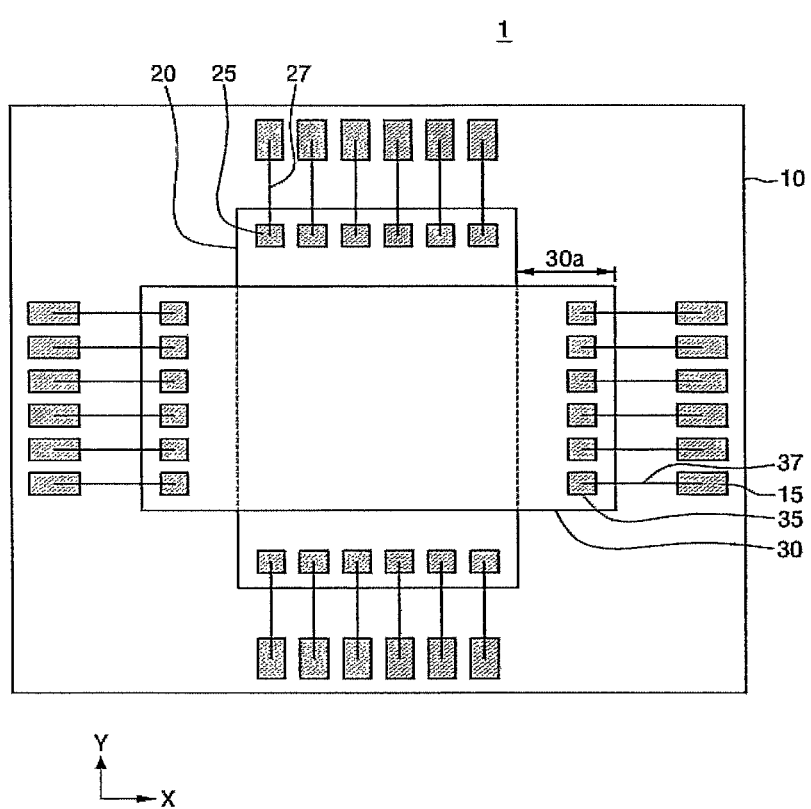
FIG. 2 is a plan view showing first and second semiconductor chips 20 and 30 cross-stacked in the semiconductor package 1 according to the first exemplary embodiment in accordance with principles of inventive concepts.
Figure 3:
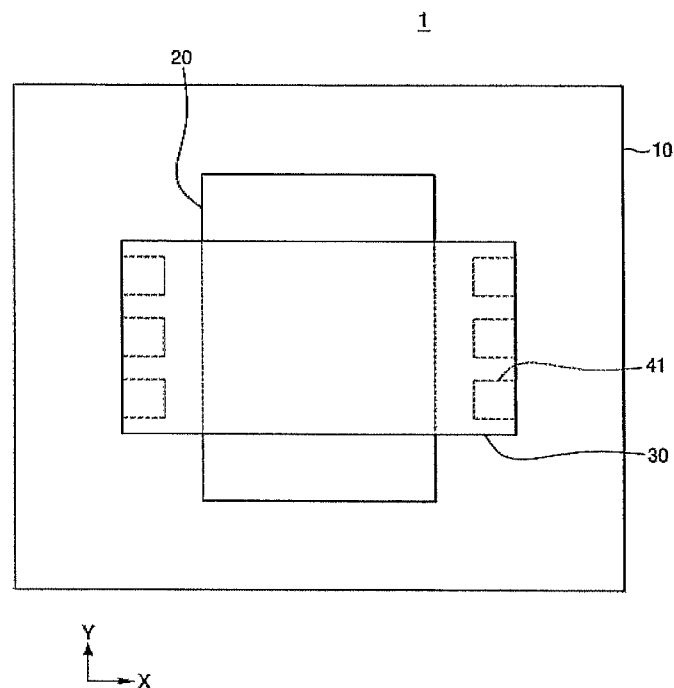
FIG. 3 is a plan view showing the positions of first dry film solder resist dams 41 in the semiconductor package 1 according to the first exemplary embodiment in accordance with principles of inventive concepts.

A semiconductor package according to a first exemplary embodiment in accordance with principles of inventive concepts will be described with reference to FIGS. 1 through 3. FIG. 1 is a cross-sectional view of a semiconductor package 1 and FIG. 2 is a plan view showing first and second semiconductor chips 20 and 30 cross-stacked in the semiconductor package 1 according to the first exemplary embodiment in accordance with principles of inventive concepts. FIG. 3 is a plan view showing locations of first dry film solder resist dams 41 in the semiconductor package 1 according to the first exemplary embodiment in accordance with principles of inventive concepts.

Referring to FIG. 1, the semiconductor package 1 may comprise a circuit board 10, the first and second semiconductor chips 20 and 30, and the first dry film solder resist dams 41.

The circuit board 10 may be, for example, a wafer or a printed circuit board (PCB). The circuit board 10 may comprise first and second surfaces 10a and 10b (also referred to herein as "top" and "bottom" surfaces, respectively). The first surface 10a may be characterized as a surface upon which the first and second semiconductor chips 20 and 30 are stacked, and the second surface 10b may be characterized as a surface opposite the first surface 10a, or as the surface upon which first external connections 60 are formed.

A first liquid solder resist film 11 may be formed on the first surface 10a of the circuit board 10, and a second liquid solder resist film 12 may be formed on the second surface 10b of the circuit board 10. In exemplary embodiments in accordance with principles of inventive concepts, the first liquid solder resist film 11 may cover at least part of the first surface 10a, and the second liquid solder resist film 12 may cover at least part of the second surface 10b.

Bonding pads 15 may be formed on the first surface 10a of the circuit board 10. The bonding pads 15 may be left uncovered by the first liquid solder resist film 11.

The first semiconductor chip 20 may be stacked on the first surface 10a of the circuit board 10, attached to the first surface 10a at least partially through first solder resist film 11, for example, by a first adhesive layer 21 formed on a surface of the first semiconductor chip 20.

The first semiconductor chip 20 and the second semiconductor chip 30, which will be described in greater detail later, may be made of materials including, for example, silicon, silicon on insulator (SOI), or silicon germanium. A plurality of wiring layers, active devices, including transistors, and passive devices may be integrated in each of the first and second semiconductor chips 20 and 30.

Referring to FIGS. 1 and 2, the second semiconductor chip 30 may be stacked on the first semiconductor chip 20. For example, a second adhesive layer 31 may be formed on a surface of the second semiconductor chip 30 to attach the second semiconductor chip 30 to the first semiconductor chip 20. The semiconductor package 1 according to the first exemplary embodiment in accordance with principles of inventive concepts may be a low profile cross stack package. Therefore, the second semiconductor chip 30 may be stacked on the first semiconductor chip 20 to cross the first semiconductor chip 20. That is, for example, the first semiconductor chip 20 may be stacked on the circuit board 10 such that a long side of the first semiconductor chip 20 is parallel to a first direction (for example, a y direction). Then, the second semiconductor chip 30 may be stacked on the first semiconductor chip 20 such that a long side of the second semiconductor chip 30 is parallel to a second direction (for example, an x direction) different from (for example, orthogonal to) the first direction.

When the first and second semiconductor chips 20 and 30 are cross-stacked, they may have non-overlapping regions. That is, for example, the second semiconductor chip 30 may include first protruding regions 30a protruding from a side of the first semiconductor chip 20.

Referring to FIGS. 1 and 2, because the first and second semiconductor chips 20 and 30 are cross-stacked, they can be easily wire-bonded to the circuit board 10. For example, first terminal pads 25 may be formed in each region of the first semiconductor chip 20 which is not overlapped by the second semiconductor chip 30. Therefore, the first terminal pads 25 of the first semiconductor chip 20 may be electrically connected to the bonding pads 15 of the circuit board 10 by first conductive wires 27. Second terminal pads 35 may be formed in each of the first protruding regions 30a of the second semiconductor chip 30 which do not overlap the first semiconductor chip 20 and the second terminal pads 35 of the second semiconductor chip 30 may be electrically connected to the bonding pads 15 of the circuit board 10 by second conductive wires 37.

In exemplary embodiments in accordance with principles of inventive concepts, dry film solder resist dams 41 may be formed on the first surface 10a of the circuit board 10. Specifically, the first dry film solder resist dams 41 may be situated between the first surface 10a of the circuit board 10 and each of the first protruding regions 30a of the second semiconductor chip 30. In accordance with principles of inventive concepts, each of the first protruding regions 30a may be supported by the first dry film solder resist dams 41. The height of the first dry film solder resist dams 41 may be substantially equal to a height of the first semiconductor chip 20. Therefore, a region of the second semiconductor chip 30 which overlaps the first semiconductor chip 20 may be supported by the first semiconductor chip 20, and the first protruding regions 30a of the second semiconductor chip 30 may be supported by the first dry film solder resist dams 41.

Referring to FIG. 3, in exemplary embodiments in accordance with principles of inventive concepts, the first dry film solder resist dams 41 may be arranged at regular intervals along a side of the second semiconductor chip 30. That is, the first dry film solder resist dams 41 may form a column along, for example, the first direction (for example, the y direction).

When the first dry film solder resist dams 41 are arranged in a column, they can support the second semiconductor chip 30 efficiently. In addition, in exemplary embodiments in which the first dry film solder resist dams 41 are located under both sides of the second semiconductor chip 30, they can support the second semiconductor chip 30 on both sides.

A cross section of each of the first dry film solder resist dams 41 taken parallel to the first surface 10a may be rectangular, triangular, circular, or elliptical, for example.

The first dry film solder resist dams 41 may be formed on the first liquid solder resist film 11 on the first surface 10a of the circuit board 10. The first dry film solder resist dams 41 may be distinguished from the first liquid solder resist film 11 in that they are made of a dry film solder resist film. In accordance with principles of inventive concepts, because dry film solder resist film may be patterned to a precise, uniform, thickness, the first dry film solder resist dams 41 may be employed to form light, thin, compact, and reliable semiconductor package 1.

An encapsulant 50 may be formed on the first surface 10a of the circuit board 10 to encapsulate the first semiconductor chip 20 and the second semiconductor chip 30. Specifically, gaps between the first semiconductor chip 20 and the first dry film solder resist dams 41 and a gap between the second semiconductor chip 30 and the first surface 10a of the circuit board 10 may be filled with the encapsulant 50. The encapsulant 50 may be, for example, an epoxy molding compound (EMC).

First external connection terminals 60 may be formed on the second surface 10b of the circuit board 10. The first external connection terminals 60 may be conductive balls or solder balls, for example. In accordance with principles of inventive concepts, the first external connection terminals 60 may also be any one of conductive bumps, conductive spacers, and a pin grid array (PGA).

In exemplary embodiments in accordance with principles of inventive concepts, protruding regions 30a of cross-stacked semiconductor chips may be supported, for example, by dry film solder resist dams 41. By supporting protruding regions 30a, a semiconductor package 1 including cross-stacked semiconductor chips in accordance with principles of inventive concepts may avoid the cracking of, for example, second, or upper 30 stacked chips that may otherwise occur, during wire-bonding, for example. Additionally, supporting cantilevered protruding regions 30a may prevent the bending of protruding regions 30a (which may or may not be accompanied by cracking of the second semiconductor chip 30), thereby ensuring that encapsulating material 50 may fill the volume between first 20 and second 30 semiconductor chips without voids. In accordance with principles of inventive concepts, supporting protruding regions 30a may improve the reliability of cross-stacked semiconductor chips, for example, by preventing the cracking of semiconductor chips, during wire-bonding, for example, and by preventing voids in encapsulant material.

In particular, in the semiconductor package 1 according to the first exemplary embodiment in accordance with principles of inventive concepts, each of the first protruding regions 30a of the second semiconductor chip 30 is supported by the first dry film solder resist dams 41. Therefore, the second semiconductor chip 30 can be prevented from cracking. For example, a force may be applied to the second semiconductor chip 30 in the process of bonding the second semiconductor chip 30 and the circuit board 10 together using the second conductive wires 37. In the light, thin and compact semiconductor package 1, the second semiconductor chip 30 may be thin. Therefore, the first protruding regions 30a of the second semiconductor chip 30 can be easily bent. However, since, in exemplary embodiments in accordance with principles of inventive concepts, each of the first protruding regions 30a is supported by the first dry film solder resist dams 41, the second semiconductor chip 30 can be prevented from being bent during the wire-bonding process. Since the second semiconductor chip 30 can be prevented from being deflected during the wire-bonding process, the cracking of the second semiconductor chip 30 due to the deflection of the second semiconductor chip 30 can be prevented. Additionally, in accordance with principles of inventive concepts, the gap between the second semiconductor chip 30 and the first surface 10a of the circuit board 10 can be fully filled with the encapsulant 50, thereby improving the reliability of the semiconductor package 1.

Figure 4:
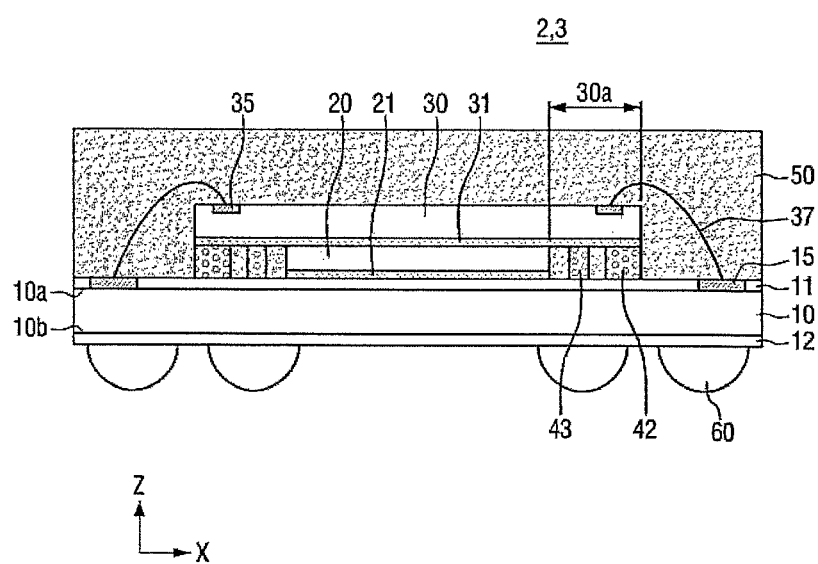
FIG. 4 is a cross-sectional view of a semiconductor package 2 according to a second exemplary embodiment in accordance with principles of inventive concepts.
Figure 5:
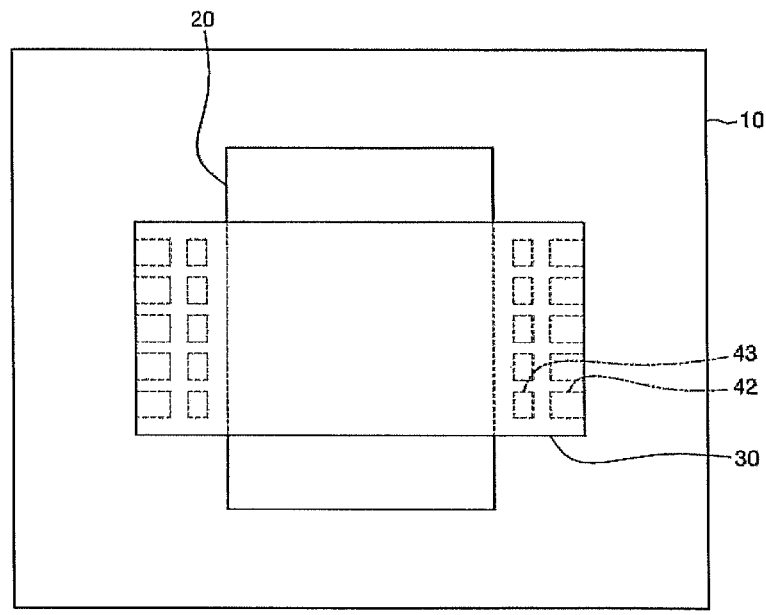
FIG. 5 is a plan view showing the positions of second and third dry film solder resist dams 42 and 43 in the semiconductor package 2 according to the second exemplary embodiment in accordance with principles of inventive concepts.

A semiconductor package according to a second exemplary embodiment in accordance with principles of inventive concepts will be described with reference to FIGS. 4 and 5. For simplicity, the following description will focus on differences between the first and second exemplary embodiments of the semiconductor package 1 in accordance with principles of inventive concepts. FIG. 4 is a cross-sectional view of a semiconductor package 2 according to a second exemplary embodiment in accordance with principles of inventive concepts. FIG. 5 is a plan view showing the positions of second and third dry film solder resist dams 42 and 43 in the semiconductor package 2 according to the second exemplary embodiment in accordance with principles of inventive concepts.

Referring to FIGS. 4 and 5, the semiconductor package 2 according to the second exemplary embodiment in accordance with principles of inventive concepts may include a plurality of columns of dry film solder resist dams.

Referring to FIG. 4, the second and third dry solder resist dams 42 and 43 may be formed between each of first protruding regions 30a of a second semiconductor chip 30 and a first surface 10a of a circuit board 10. The second and third dry film solder resist dams 42 and 43 may be located to the side of a first semiconductor chip 20. The third dry film solder resist dams 43 may be located closer to the side of the first semiconductor chip 20 than the second dry film solder resist dams 42, for example.

Referring to FIG. 5, the second dry film solder resist dams 42 may be arranged at regular intervals along two sides of the second semiconductor chip 30. That is, the second dry film solder resist dams 42 may form a first column along a first direction (for example, a y direction). The third dry film solder resist dams 43 may be arranged at regular intervals along two sides of the second semiconductor chip 30. That is, the third dry film solder resist dams 43 may form a second column along the first direction (for example, they direction). The first column of the second dry film resist dams 42 may neighbor, or, be proximate, the second column of the third dry film solder resist dams 32.

In accordance with principles of inventive concepts, the cross-sectional areas (taken parallel to the plane of surface 10a, for example) of the second 42 and third 43 dry film solder resist dams may differ from one another, with the cross-sectional area of the second dry film solder resist dam 42 being larger or smaller than the cross-sectional are of the third dry film solder resist dam 43, for example. The cross-sectional shape of the solder resist dams 42,43 may be rectangular, circular, elliptical, triangular, or another shape, for example.

The semiconductor package 2 according to a second exemplary embodiment in accordance with principles of inventive concepts includes second and third dry film solder resist dams 42 and 43, which form first and second columns. In this exemplary embodiment, each of the first protruding regions 30a of the second semiconductor chip 30 may be stably supported by the second and third dry film solder resist dams 42 and 43. In this exemplary embodiment, the area of the cross section of each of the second dry film solder resist dams 42 which is parallel to the first surface 10a is larger than the area of the cross section of each of the third dry film solder resist dams 43 which is parallel to the first surface 10a, and an outer region of each of the first protruding regions 30a of the second semiconductor chip 30 can be supported stably by the second dry film solder resist dams 42, which are located relatively farther from the center and have a relatively large cross-sectional area. In addition, since an inner region of each of the first protruding regions 30a of the second semiconductor chip 30 is supported by third dry film solder resist dams 43 having a relatively small cross-sectional area, the interference in filling gaps with an encapsulant 50 by the third dry film solder resist dams 43 may be prevented.

Figure 6:
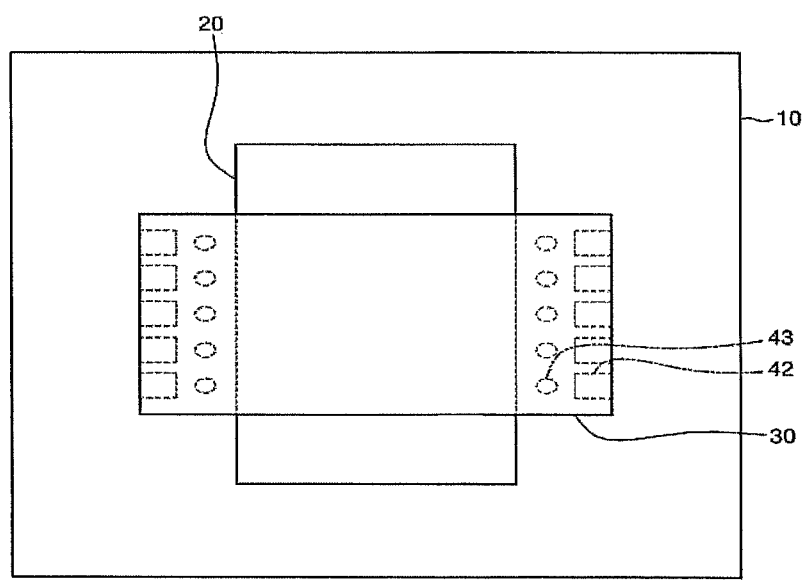
FIG. 6 is a plan view showing the positions of second and third dry film solder resist dams 42 and 43 in the semiconductor package 3 according to the third exemplary embodiment in accordance with principles of inventive concepts.

A semiconductor package according to a third exemplary embodiment in accordance with principles of inventive concepts will be described with reference to FIGS. 4 through 6. For simplicity, the following description will focus on differences between this third exemplary embodiment and the semiconductor package 2 according to the second exemplary embodiment in accordance with principles of inventive concepts. FIG. 6 is a plan view showing the positions of second and third dry film solder resist dams 42 and 43 in the semiconductor package 3 according to a third exemplary embodiment in accordance with principles of inventive concepts.

Referring to FIG. 6, in the semiconductor package 3 according to a third exemplary embodiment in accordance with principles of inventive concepts, the cross section (parallel with first surface 10a) of each of the second dry film solder resist dams 42 which is parallel may be, for example, rectangular, and the cross section of each of the third dry film solder resist dams 43 may be, for example, circular. With circular cross sections of the third dry film solder resist dams 43, gaps between first protruding regions 30a of a second semiconductor chip 30 and the first surface 10a of a circuit board 10 may be readily filled with an encapsulant 50.

Figure 7:
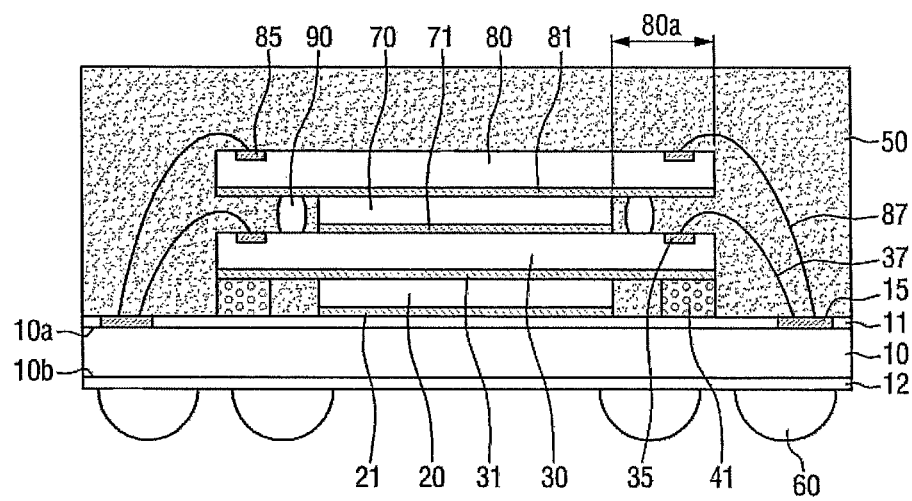
FIG. 7 is a cross-sectional view of a semiconductor package 4 according to a fourth exemplary embodiment in accordance with principles of inventive concepts.

A semiconductor package according to a fourth exemplary embodiment in accordance with principles of inventive concepts will be described with reference to FIG. 7. For simplicity, the following description will focus on differences between semiconductor package 1 according to the first exemplary embodiment and the current, fourth, exemplary embodiment in accordance with principles of inventive concepts. FIG. 7 is a cross-sectional view of a semiconductor package 4 according to a fourth exemplary embodiment in accordance with principles of inventive concepts.

Referring to FIG. 7, semiconductor package 4 according to a fourth exemplary embodiment in accordance with principles of inventive concepts may include a third semiconductor chip 70 stacked on a second semiconductor chip 30 and a fourth semiconductor chip 80 stacked on the third semiconductor chip 70. The third semiconductor chip 70 may be stacked on the second semiconductor chip 30 to cross the second semiconductor chip 30. Third and fourth adhesive layers 71 and 81 may be formed on respective surfaces of the third and fourth semiconductor chips 70 and 80, respectively.

Third terminal pads 85 may be formed in each of second protruding regions 80a of the fourth semiconductor chip 80 which do not overlap the third semiconductor chip 70. Third terminal pads 85 of the fourth semiconductor chip 80 may be electrically connected to bonding pads 15 of a circuit board 10 by third conductive wires 87.

The fourth semiconductor chip 80 may be stacked on the third semiconductor chip 70 to cross the third semiconductor chip 70. When the third and fourth semiconductor chips 70 and 80 are cross-stacked, they may have non-overlapping regions. For example, the fourth semiconductor chip 80 may include second protruding regions 80a protruding from both sides of the third semiconductor chip 70. The second protruding regions 80a may be regions of the fourth semiconductor chip 80 which do not overlap, that is, which cantilever beyond, the outline of third semiconductor chip 70.

Epoxy dams 90 may be formed between each of the second protruding regions 80a of the fourth semiconductor chip 80 and the second semiconductor chip 30. For example, the epoxy dams 90 may be formed on the second semiconductor chip 30 using a liquid adhesive. In accordance with principles of inventive concepts, through use of supports, such as epoxy dams 90, crack formation or deformation of the fourth semiconductor chip 80 may be avoided.

In exemplary embodiments in accordance with principles of inventive concepts, first protruding regions 30a of the second semiconductor chip 30 may be overlapped by the second protruding regions 80a of the fourth semiconductor chip 80. The epoxy dams 90 may be formed, for example, between each of the first protruding regions 30a and a corresponding one of the second protruding regions 80a. The height of the epoxy dams 90 may be substantially identical to a height of the third semiconductor chip 70, for example.

Figure 8:
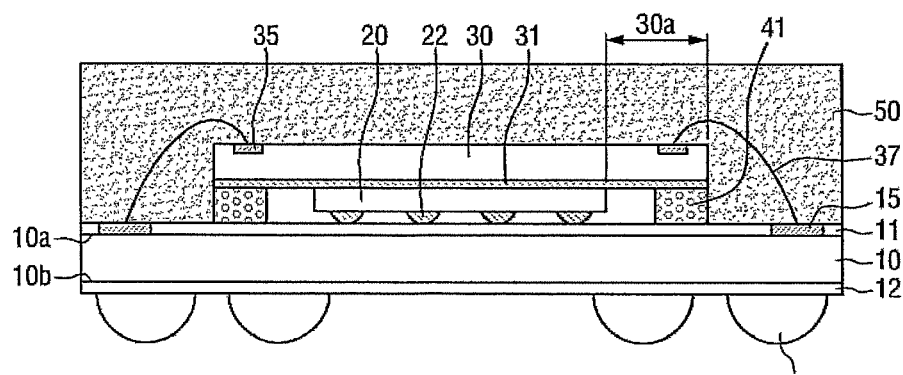
FIG. 8 is a cross-sectional view of a semiconductor package 5 according to a fifth exemplary embodiment in accordance with principles of inventive concepts
Figure 9:
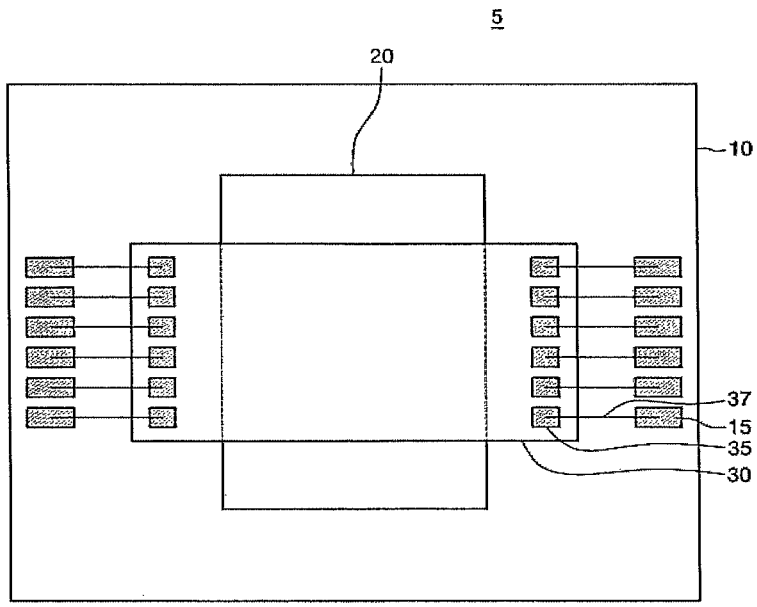
FIG. 9 is a plan view showing first and second semiconductor chips 20 and 30 cross-stacked in the semiconductor package 5 according to the fifth exemplary embodiment in accordance with principles of inventive concepts.

A semiconductor package according to a fifth exemplary embodiment in accordance with principles of inventive concepts will be described with reference to FIGS. 8 and 9. For simplicity, the following description will focus on differences between the semiconductor package 1 according to the first exemplary embodiment and the current, fifth, exemplary embodiment in accordance with principles of inventive concepts. FIG. 8 is a cross-sectional view of a semiconductor package 5 according to a fifth exemplary embodiment in accordance with principles of inventive concepts. FIG. 9 is a plan view showing first and second semiconductor chips 20 and 30 cross-stacked in the semiconductor package 5 according to a fifth exemplary embodiment in accordance with principles of inventive concepts.

Referring to FIGS. 8 and 9, in the semiconductor package 5, the first semiconductor chip 20 is flip-chip bonded to a first surface 10a of a circuit board 10. For example, first conductive bumps 22 may be formed between the first semiconductor chip 20 and the circuit board 10. The first semiconductor chip 20 and the circuit board 10 may be electrically connected to each other by the first conductive bumps 22, for example.

Figure 10:
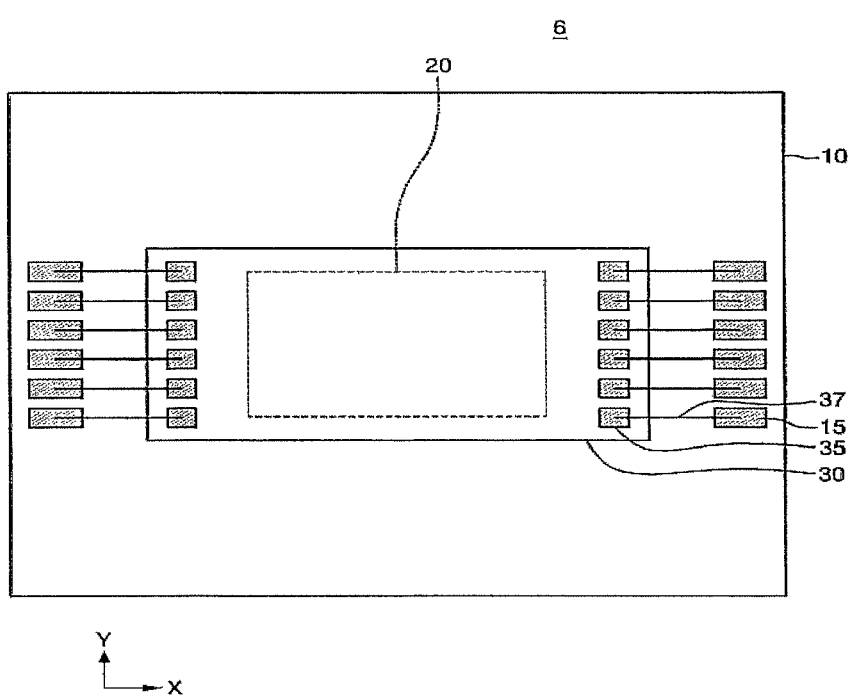
FIG. 10 is a plan view showing first and second semiconductor chips 20 and 30 cross-stacked in a semiconductor package 6 according to a sixth exemplary embodiment in accordance with principles of inventive concepts.
Figure 11:
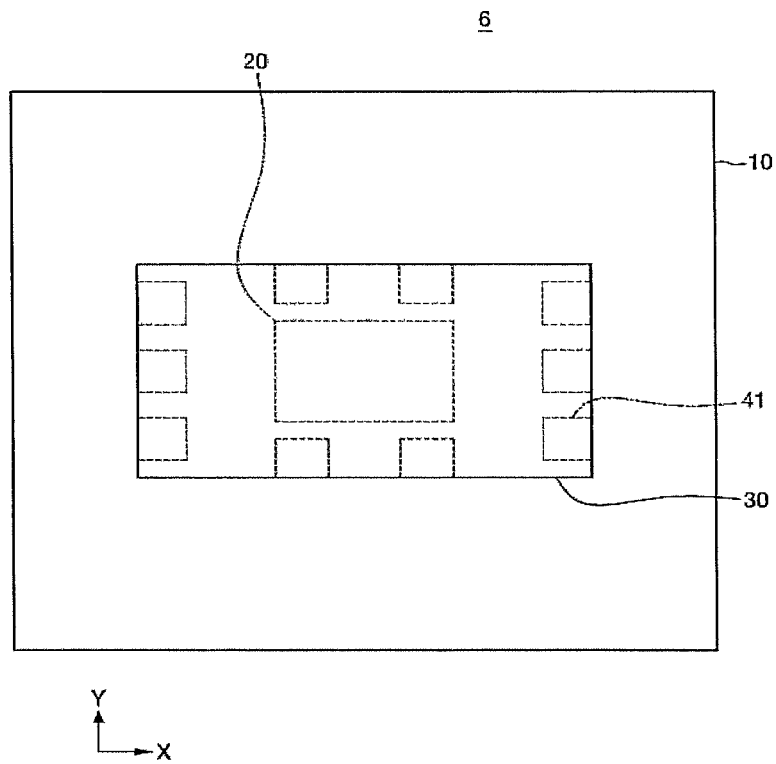
FIG. 11 is a plan view showing the positions of first dry film solder resist dams 41 in the semiconductor package 6 according to the sixth exemplary embodiment in accordance with principles of inventive concepts.

A semiconductor package according to a sixth exemplary embodiment of the present inventive concept will be described with reference to FIGS. 8, 10 and 11. For simplicity, the following description will focus on differences between semiconductor package 5 according to the fifth exemplary and the current, sixth, exemplary embodiment in accordance with principles of inventive concepts. FIG. 10 is a plan view showing first and second semiconductor chips 20 and 30 cross-stacked in a semiconductor package 6 according to a sixth exemplary embodiment in accordance with principles of inventive concepts. FIG. 11 is a plan view showing the locations of first dry film solder resist dams 41 in the semiconductor package 6 according to the sixth exemplary embodiment in accordance with principles of inventive concepts.

Referring to FIG. 10, in the semiconductor package 6 according to the sixth embodiment of the present inventive concept, the first semiconductor chip 20 may be smaller than the second semiconductor chip 30. The second semiconductor chip 30 may be stacked on the first semiconductor chip 20 to cover the first semiconductor chip 20. In such an exemplary embodiment, a first protruding region 30a may be formed along all sides of the semiconductor chip 30.

Referring to FIG. 11, the first dry film solder resist dams 41 may be formed along four edges of the second semiconductor chip 30. That is, the first dry film solder resist dams 41 may be arranged along a perimeter of the second semiconductor chip 30 to be separated from each other. In such an exemplary embodiment, the second semiconductor chip 30 can be fully supported in all protruding regions by the first dry film solder resist dams 41.

Figure 12:
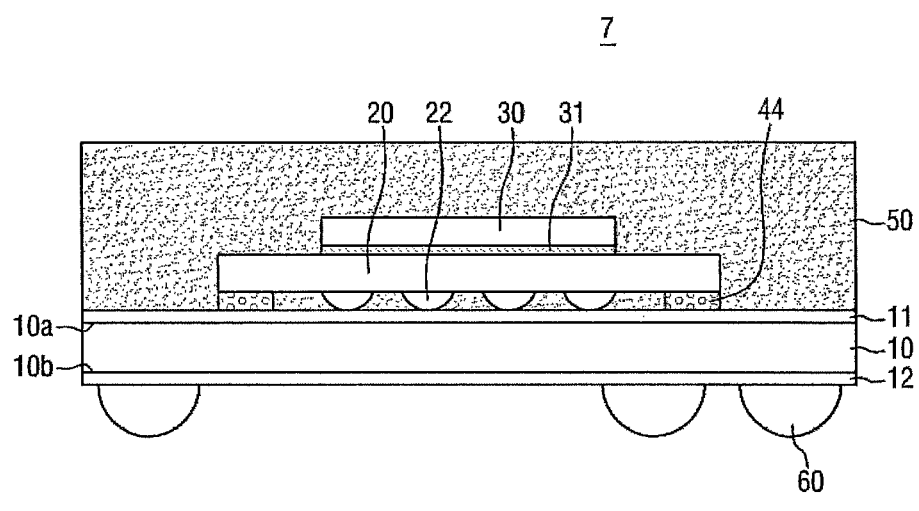
FIG. 12 is a cross-sectional view of a semiconductor package 7 according to a seventh exemplary embodiment in accordance with principles of inventive concepts.
Figure 13:
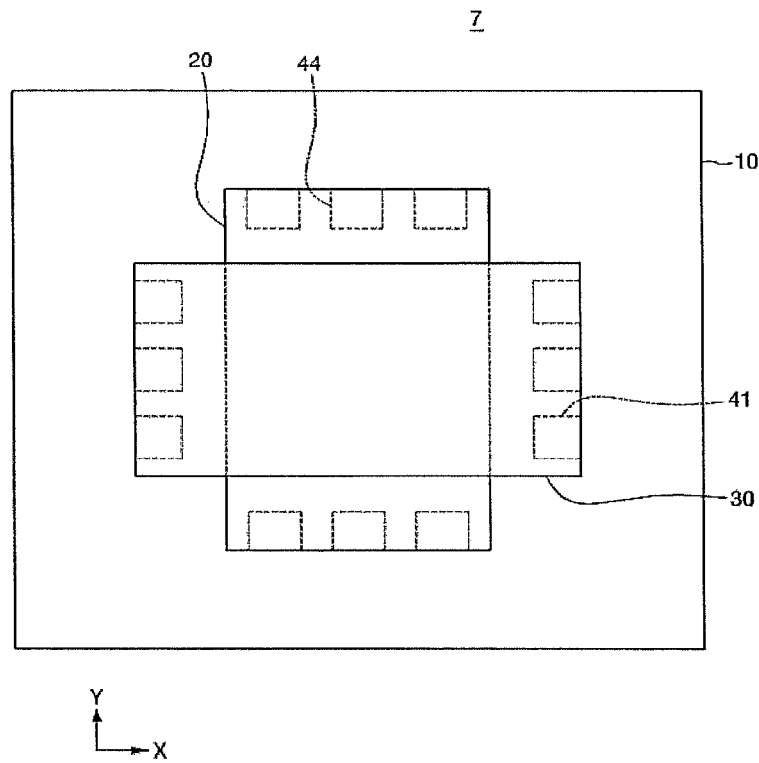
FIG. 13 is a plan view showing the positions of first and fourth dry film solder resist dams 41 and 44 in the semiconductor package 7 according to the seventh exemplary embodiment in accordance with principles of inventive concepts.

A semiconductor package according to a seventh exemplary embodiment in accordance with principles of inventive concepts will be described with reference to FIGS. 8, 12 and 13. For simplicity, the following description will focus on differences between semiconductor package 5 according to the fifth exemplary embodiment and the current, seventh, exemplary embodiment in accordance with principles of inventive concepts. FIG. 12 is a cross-sectional view of a semiconductor package 7 according to a seventh exemplary embodiment in accordance with principles of inventive concepts. FIG. 13 is a plan view showing the locations of first and fourth dry film solder resist dams 41 and 44 in the semiconductor package 7 according to the seventh exemplary embodiment in accordance with principles of inventive concepts.

Referring to FIG. 8, in the semiconductor package 7, the first dry film solder resist dams 41 may be formed between each of first protruding regions 30a of a second semiconductor chip 30 and a first surface 10a of a circuit board 10. That is, the first dry film solder resist dams 41 may be formed under both sides of the second semiconductor chip 30 to support the second semiconductor chip 30.

Referring to FIG. 12, in the semiconductor package 7 according to the seventh exemplary embodiment in accordance with principles of inventive concepts, the fourth dry film solder resist dams 44 may be formed under both sides of a first semiconductor chip 20. In particular, in this exemplary embodiment the first semiconductor chip 20 is flip-chip bonded to the first surface 10a of the circuit board 10. First conductive bumps 22 may be formed between the first semiconductor chip 20 and the circuit board 10, and the first semiconductor chip 20 and the circuit board 10 may be electrically connected to each other by the first conductive bumps 22. The fourth dry film solder resist dams 44 may be separated from the first conductive bumps 22. With the first semiconductor chip 20 supported by the fourth dry film solder resist dams 44, a prescribed gap between the first semiconductor chip 20 and the circuit board 10 may be readily maintained.

Referring to FIG. 13, as described above in the discussion related to FIGS. 8 and 12, the fourth dry film solder resist dam 44 may be located between each region of the first semiconductor chip 20 which is not overlapped by the second semiconductor chip 30 and the first surface 10a of the circuit board 10. In addition, the first dry film solder resist dams 41 may be located between each of the first protruding regions 30a of the second semiconductor chip 30 which do not overlap the first semiconductor chip 20 and the first surface 10a of the circuit board 10. In such exemplary embodiments in accordance with principles of inventive concepts, the first and second semiconductor chips 20 and 30 may be supported by the fourth and first dry film solder resist dams 44 and 41, respectively.

A package-on-package (PoP) system using any one of the semiconductor packages 1 through 7 according to the first through seventh exemplary embodiments in accordance with principles of inventive concepts will be described with reference to FIG. 14, which is a cross-sectional view of a PoP system 100 using any one of the semiconductor packages 1 through 7 according to the first through seventh exemplary embodiments in accordance with principles of inventive concepts.

Figure 14:
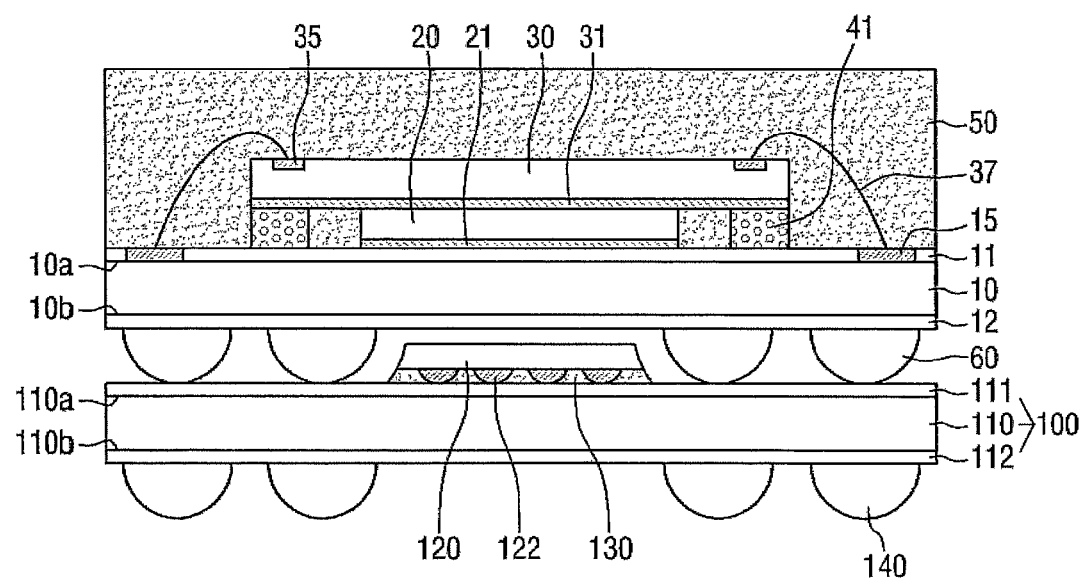
FIG. 14 is a cross-sectional view of a PoP system 100 using any one of the semiconductor packages 1 through 7 according to the first through seventh exemplary embodiments in accordance with principles of inventive concepts.

Referring to FIG. 14, the PoP system 100 may include a top package and a bottom package. In the PoP system 100, the top package may be stacked on the bottom package. The top package may be a semiconductor package such as any of the previously-described exemplary semiconductor packages 1-7 in accordance with principles of inventive concepts, for example.

The bottom package may include a bottom circuit board 110 having an upper, also referred to herein as a third, surface 110*a* and a lower, also referred to herein as a fourth, surface 110*b*. Third and fourth liquid solder resist films 111 and 112 may be formed on the third and fourth surfaces 110*a* and 110*b* of the bottom circuit board 110, respectively. The top package may be stacked on the third, or upper, surface 110*a* of the bottom circuit board 110. A fifth semiconductor chip 120 may be stacked on the third, or upper, surface 110*a* of the bottom circuit board 110. The fifth semiconductor chip 120 may be flip-chip bonded to the bottom circuit board 110 by, for example, second conductive bumps 122. A gap between the fifth semiconductor chip 120 and the third surface 110*a* of the bottom circuit board 110 may be filled with an underfill member 130. The structure of the bottom package is not limited to the above exemplary structure.

A method of fabricating a semiconductor package according to a first exemplary embodiment in accordance with principles of inventive concepts will be described with reference to FIG. 1 and sequential cross-sectional views of FIGS. 15 to 19.

Figure 15:
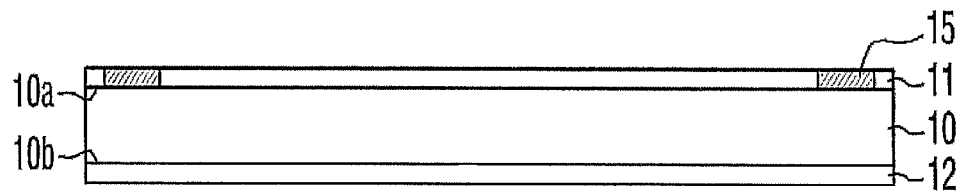
FIGS. 15 to 19 are cross-sectional views illustrating a method of fabricating a semiconductor package according to a first exemplary embodiment in accordance with principles of inventive concepts.

Referring to FIG. 15, a circuit board 10 having a first, "upper," surface 10*a* and a second, "lower," surface 10*b* opposite the first surface 10*a* may be provided. A first liquid solder resist film 11 may be formed on the first surface 10*a* of the circuit board 10 to cover at least part of the first surface 10*a*. A second liquid solder resist film 12 may be formed on the second surface 10*b* of the circuit board 10 to cover at least part of the first surface 10*b*.

Figure 16:
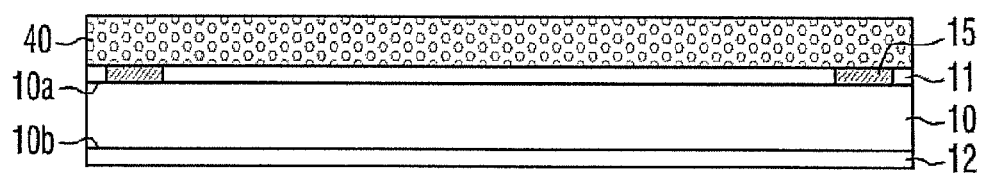

Referring to FIG. 16, a dry film solder resist film 40 may be formed on the first surface 10*a* of the circuit board 10.

Figure 17:
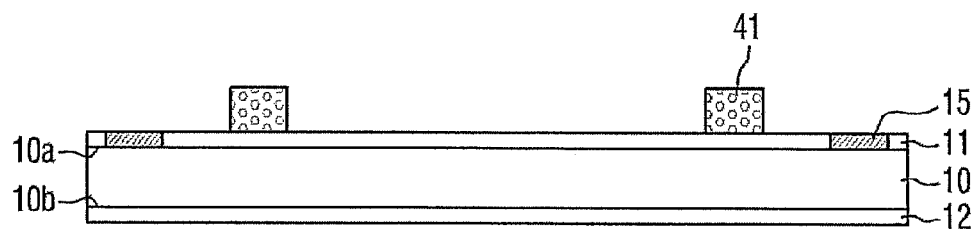

Referring to FIG. 17, the dry film solder resist film 40 may be patterned to form first dry film solder resist dams 41 on the first surface 10*a* of the circuit board 10. The dry film solder resist film 40 may be readily patterned to have a precise, uniform, thickness, which makes it suitable for formation of the first dry film solder resist dams 41 in a light, thin, compact and reliable semiconductor package in accordance with principles of inventive concepts.

Figure 18:
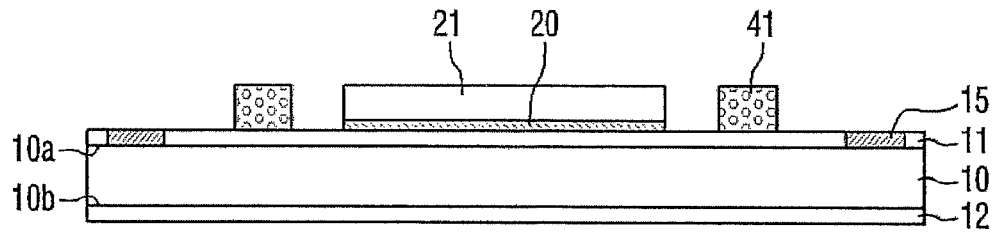

Referring to FIG. 18, a first semiconductor chip 20 may be stacked on the first surface 10*a* of the circuit board 10 to be separated from the first dry film solder resist dams 41. For example, a first adhesive layer 21 may be formed on a surface of the first semiconductor chip 20. The height of the first dry film solder resist dams 41 may be substantially equal to the height of the first semiconductor chip 20.

Figure 19:
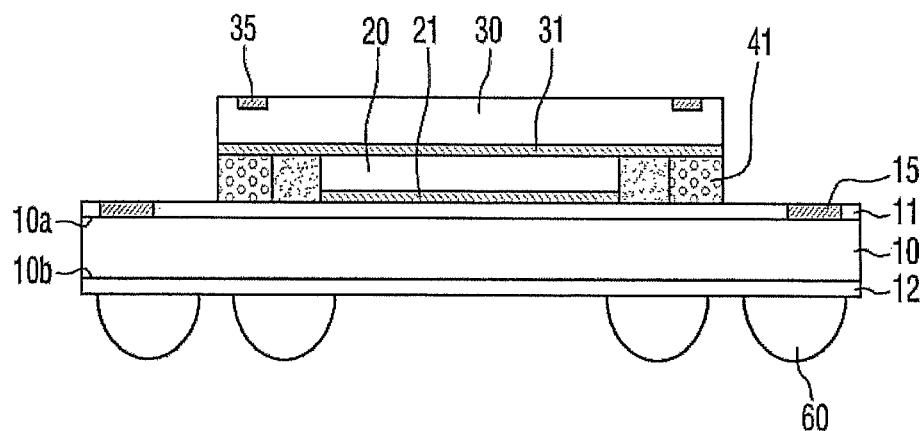

Referring to FIG. 19, a second semiconductor chip 30 may be stacked on the first semiconductor chip 20 and the first dry film solder resist dams 41, such that a region of the second semiconductor chip 20 is supported by the first semiconductor chip 20 and the other regions thereof are supported by the first dry film solder resist dams 41. A second adhesive layer 31 may be formed on a surface of the second semiconductor chip 30.

Referring to FIG. 1, second terminal pads 35 of the second semiconductor chip 30 may wire-bonded to bonding pads 15 of the circuit board 10 using first conductive wires 27. Then, the first semiconductor chip 20 and the second semiconductor chip 30 may be molded with an encapsulant 50.

The method of fabricating a semiconductor package according to the present inventive concept is not limited to the above method and can be modified, for example, to form components of the semiconductor packages 2 through 7 according to the second through seventh exemplary embodiments in accordance with principles of inventive concepts.

Semiconductor systems according to first through third exemplary embodiments in accordance with principles of inventive concepts will be described with reference to FIGS. 20 through 23.

Figure 20:
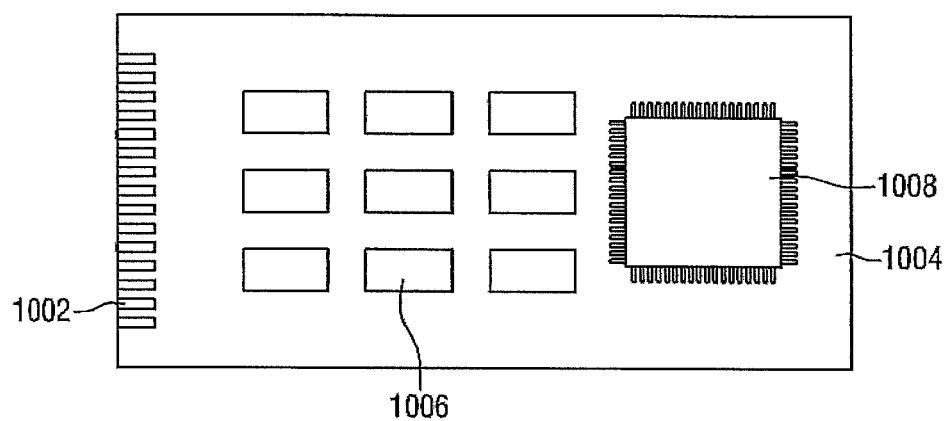
FIG. 20 is a plan view of a semiconductor system 1000 according to a first exemplary embodiment in accordance with principles of inventive concepts.

FIG. 20 is a plan view of a semiconductor system 1000 according to a first exemplary embodiment in accordance with principles of inventive concepts. The semiconductor system 1000 may be a package module, for example. The semiconductor system 1000 may include a module substrate 1004 that includes external connection terminals 1002 and semiconductor devices 1006 and 1008, for example. The semiconductor device 1008 may be a quad flat package (QFP), for example. Either one, or both, of the semiconductor devices 1006 and 1008 may employ a semiconductor package, such as one of the exemplary semiconductor packages described above with reference to FIGS. 1 through 13. Such a package may include a circuit board which includes a first surface and a second surface opposite the first surface, a first semiconductor chip that is stacked on the first surface, a second semiconductor chip that is stacked on the first semiconductor chip and includes first protruding regions protruding from two sides of the first semiconductor chip, and dry film solder resist dams that are located between each of the first protruding regions and the first surface to support each of the first protruding regions.

Figure 21:
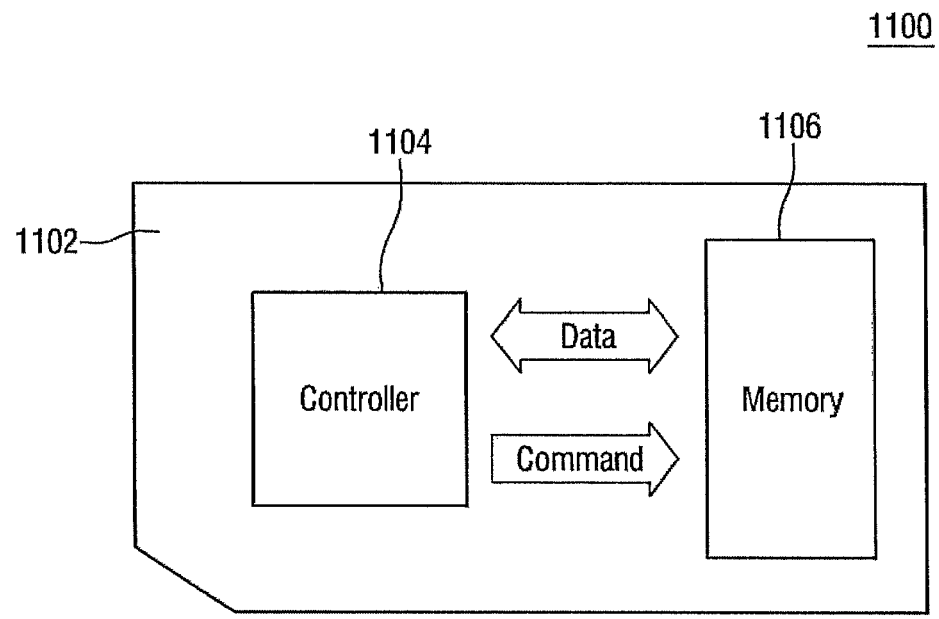
FIG. 21 is a block diagram of a semiconductor system 1100 according to a second exemplary embodiment in accordance with principles of inventive concepts.

FIG. 21 is a block diagram of a semiconductor system 1100 according to a second exemplary embodiment in accordance with principles of inventive concepts. Semiconductor system 1100 may include a controller 1104 and a memory 1106 within a housing 1102. The controller 1104 and the memory 1106 may exchange electrical signals with each other. For example, the memory 1106 and the controller 1104 may exchange data with each other in response to a command from the controller 1104. The semiconductor system 1100 may store data in the memory 1106 or output data from the memory 1106 to an external destination. Either one or both of the controller 1104 and the memory 1106 may be implemented using a semiconductor package in accordance with principles of inventive concepts, such as the exemplary embodiments described above with reference to FIGS. 1 through 13.

The semiconductor system 1100 may be used as a data storage medium for any of a variety of portable devices. The semiconductor system 1100 may be implemented as a multimedia card (MMC) or a secure digital (SD) card, for example.

Figure 22:
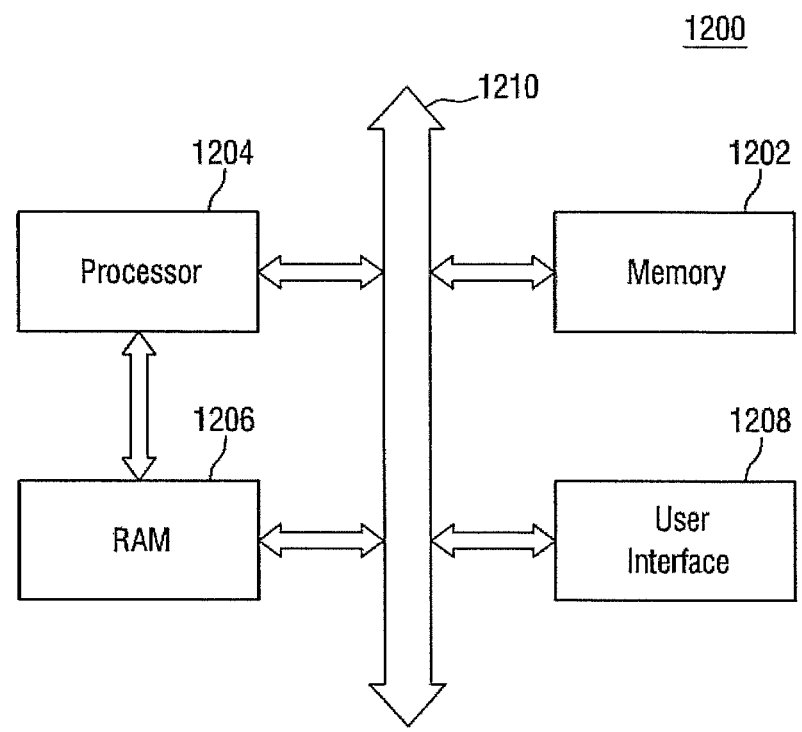
FIG. 22 is a block diagram of a semiconductor system 1200 according to a third exemplary embodiment in accordance with principles of inventive concepts.
Figure 23:
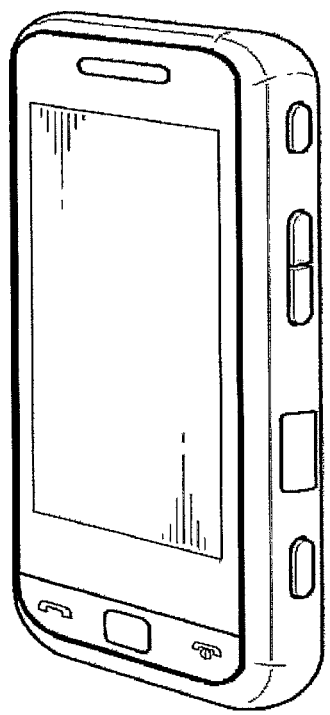
FIG. 23 is a mobile phone 1300 which can apply the semiconductor system 1200.

FIG. 22 is a block diagram of a semiconductor system 1200 according to a third exemplary embodiment in accordance with principles of inventive concepts. FIG. 23 illustrates an example electronic device to which the semiconductor system 1200 according to the third embodiment of the present inventive concept is applied.

Referring to FIG. 22, the semiconductor system 1200 according to the third exemplary embodiment may include a memory system 1202, a processor 1204, a random access memory (RAM) 1206, and a user interface 1208. These elements may exchange data with each other via a bus 1210. The processor 1204 may execute a program and control the semiconductor system 1200. The RAM 1206 may be used as a working memory of the processor 1204. The processor 1204 and the RAM 1206 may be implemented in a single package. For example, a logic chip having the processor 1204 and a memory chip having the RAM 1206 may be included in a system-in package and may communicate wirelessly with each other. The user interface 1208 may be used to input or output data to/from the semiconductor system 1200. The memory system 1202 may store codes needed to operate the processor 1204, data processed by the processor 1204, and data input from an external source. The memory system 1202 may include a controller and a memory and may be configured in substantially the same or similar manner as the memory card 1100 of FIG. 21.

A semiconductor system in accordance with principles of inventive concepts, such as the semiconductor system 1200 may be applied to, or employed by, electronic controllers of various electronic devices. For example, the semiconductor system 1200 can be applied to a mobile phone 1300 (see FIG. 23). The semiconductor system 1200 can also be applied to portable game players, portable notebooks, MP3 players, navigation devices, solid-state disks (SSDs), vehicles, and household appliances, for example.

Although exemplary embodiments in accordance with principles of inventive concepts have been shown and described, it will be understood by those of ordinary skill in the art that various changes in form and details may be made therein without departing from the spirit and scope of the present Inventive concept as defined by the following claims. It is therefore desired that the present embodiments be considered in all respects as illustrative and not restrictive, reference being made to the appended claims rather than the foregoing description to indicate the scope of the Inventive concept.

What is claimed is:

1. A semiconductor package comprising:
   a circuit board comprising a first surface and a second surface opposite the first surface;
   a first semiconductor chip stacked on the first surface;
   a second semiconductor chip cross-stacked on the first semiconductor chip, the cross-stacking leaving terminal pads on the first semiconductor chip uncovered by the second semiconductor chip and a first protruding region of the second semiconductor chip protruding beyond a side of the first semiconductor chip; a dry film solder resist dam between the first protruding region and the first surface to underpin the first protruding region; and
   a liquid solder resist film covering at least part of the first surface of the circuit board, wherein the dry film solder resist dam is directly disposed on the liquid solder resist film.

2. The semiconductor package of claim 1, wherein a plurality of dry film solder resist dams comprise first and second dry solder film resist dams located on the side of the first semiconductor chip beyond which the first protruding region protrudes, wherein the second dry film solder resist dams are located closer to the side of the first semiconductor chip than the first dry film solder resist dams, and a cross section of each of the first dry film solder resist dams is different from a cross section of each of the second dry film solder resist dams.

3. The semiconductor package of claim 2, wherein the area of the cross section of the first dry film resist dams is larger than the area of the cross section of the second dry film resist dams.

4. The semiconductor package of claim 2, wherein the plurality of dry film solder resist dams include the dry film solder resist dams having rectangular cross sections and the dry film solder resist dams having circular cross sections.

5. The semiconductor package of claim 2, wherein the dry film solder resist dams comprise a first column of dry film solder resist dams along a side of the second semiconductor chip and a second column of dry film solder resist dams along the side of the second semiconductor chip proximate the first column of the dry film solder resist dams.

6. The semiconductor package of claim 2, wherein the dry film solder resist dams are arranged along a perimeter of the second semiconductor chip.

7. The semiconductor package of claim 1, further comprising:
   a third semiconductor chip stacked on the second semiconductor chip;
   a fourth semiconductor chip stacked on the third semiconductor chip and comprising a second protruding region protruding beyond a side of the third semiconductor chip; and
   a plurality of epoxy dams located between the second protruding region and the second semiconductor chip to support the second protruding region.

8. The semiconductor package of claim 7, wherein the second protruding region overlaps at least part of the first protruding region, and the epoxy dams are between the first protruding region and the second protruding region.

9. The semiconductor package of claim 1, further comprising conductive wires electrically connecting the second semiconductor chip and the circuit board, wherein the conductive wires extend from the second semiconductor chip onto the first surface.

10. The semiconductor package of claim 9, further comprising:
    an encapsulant on the first surface to encapsulate the first semiconductor chip and the second semiconductor chip; and
    external connection terminals on the second surface.

11. A semiconductor system, comprising:
    a semiconductor memory; and
    a controller, wherein the semiconductor memory or controller is packaged in a cross-stacked package that includes:
       a circuit board comprising a first surface and a second surface opposite the first surface;
       a first semiconductor chip stacked on the first surface;
       a second semiconductor chip cross-stacked on the first semiconductor chip, the cross-stacking leaving terminal pads on the first chip uncovered by the second chip and a first region of the second chip protruding beyond a side of the first chip; and
       a dry film solder resist dam between the first protruding region and the first surface to underpin the first protruding region; and
       a liquid solder resist film covering at least part of the first surface of the circuit board, wherein the dry film solder resist dam is directly disposed on the liquid solder resist film.

12. The semiconductor system of claim 11, wherein the controller and memory are packaged in the cross-stacked package.

13. A memory system including the semiconductor system of claim 12.

14. The memory system of claim 13 wherein the system is one of a multimedia card or secure digital card.

15. A mobile phone including the semiconductor system of claim 12.

* * * * *